(12) United States Patent
Pavelchek et al.

(10) Patent No.: US 6,653,049 B2
(45) Date of Patent: Nov. 25, 2003

(54) HIGH CONFORMALITY ANTIREFLECTIVE COATING COMPOSITIONS

(75) Inventors: Edward K. Pavelchek, Stow, MA (US); Manuel DoCanto, Stoughton, MA (US); Timothy G. Adams, Sudbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/788,111

(22) Filed: Feb. 17, 2001

(65) Prior Publication Data

US 2001/0012598 A1 Aug. 9, 2001

Related U.S. Application Data

(63) Continuation of application No. 09/007,590, filed on Jan. 15, 1998, now Pat. No. 6,190,839.

(51) Int. Cl.[7] .................................................. G03F 7/11
(52) U.S. Cl. ................... 430/272.1; 430/326; 430/330; 430/311; 430/325; 430/271.1
(58) Field of Search ................ 430/326, 325, 430/330, 311, 272.1, 271.1

(56) References Cited

U.S. PATENT DOCUMENTS

| | | | |
|---|---|---|---|
| 4,060,656 A | 11/1977 | Naka et al. | 428/355 |
| 4,362,809 A | 12/1982 | Chen et al. | 430/312 |
| 4,370,405 A | 1/1983 | O'Toole et al. | 430/312 |
| 4,491,628 A | 1/1985 | Ito et al. | 430/176 |
| 4,910,122 A | 3/1990 | Arnold et al. | 430/313 |
| 5,069,997 A | 12/1991 | Schwalm et al. | |
| 5,294,680 A | 3/1994 | Knors et al. | 525/327.4 |
| 5,350,660 A | 9/1994 | Urano et al. | 430/176 |
| 5,368,989 A | 11/1994 | Flaim et al. | 430/271.1 |
| 5,401,613 A | 3/1995 | Brewer et al. | 430/271.1 |
| 5,410,005 A | 4/1995 | Nemoto et al. | 526/245 |
| 5,498,748 A | 3/1996 | Urano et al. | 560/67 |
| 5,541,037 A | 7/1996 | Hatakeyama et al. | 430/273.1 |
| 5,597,868 A | 1/1997 | Kunz | 525/154 |
| 5,607,824 A | 3/1997 | Fahey et al. | 430/271.1 |
| 5,624,789 A | 4/1997 | Rahman et al. | 430/311 |
| 5,652,297 A | 7/1997 | McCulloch et al. | 524/555 |
| 5,652,317 A | 7/1997 | McCulloch et al. | 526/312 |
| 5,693,691 A | 12/1997 | Flaim et al. | 430/271.1 |
| 5,756,255 A | 5/1998 | Sato et al. | 430/271.1 |
| 5,919,599 A | 7/1999 | Meador et al. | 430/271.1 |
| 6,165,697 A | * 12/2000 | Thackeray et al. | 430/325 |

FOREIGN PATENT DOCUMENTS

| | | | |
|---|---|---|---|
| EP | 0 542 008 A1 | 5/1993 | |
| EP | 0 698 823 A1 | 2/1996 | 430/271.1 |
| EP | 0 813 114 A2 | 12/1997 | 430/271.1 |
| WO | WO 90/03598 | 4/1990 | |

* cited by examiner

*Primary Examiner*—Cynthia Hamilton
(74) *Attorney, Agent, or Firm*—Peter F. Corless; Darryl P. Frickey; Edwards & Angell, LLP

(57) ABSTRACT

The present invention provides new light absorbing compositions suitable for use as antireflective coating compositions ("ARCs"), particularly for deep UV applications. The antireflective compositions of the invention in general comprise a resin binder component that contains a high molecular weight polymer, e.g. a polymer having an $M_w$ of at least about 40,000 daltons. ARCs of the invention exhibit exceptional conformality upon application to a substrate surface. For example, ARCs of the invention can coat substantial topography such as vertical and sloping steps with high conformality.

30 Claims, 1 Drawing Sheet

HIGH CONFORMALITY ANTIREFLECTIVE COATING COMPOSITIONS

This is a continuation of application Ser. No. 09/007,590, filed Jan. 15, 1998, now U.S. Pat. No. 6,190,839.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions that can be applied as coating layers that are highly conformal with respect to an underlying substrate.

2. Background Art

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions in general are known to the art and described by Deforest, *Photoresist Materials and Processes,* McGraw Hill Book Company, New York, ch. 2, 1975 and by Moreau, *Semiconductor Lithography, Principles, Practices and Materials,* Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength), KrF excimer laser light (248.4 nm) and ArF excimer laser light (193 nm). The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Another approach used to reduce the problem of reflected radiation has been the use of a radiation absorbing layer interposed between the substrate surface and the photoresist coating layer. See, for example, PCT Application WO 90/03598, EPO Application No. 0 639 941 A1 and U.S. Pat. Nos. 4,910,122, 4,370,405 and 4,362,809, all incorporated herein by reference for their teaching of antireflective (antihalation) compositions and the use of the same. Such layers have also been referred to as antireflective layers or antireflective compositions or "ARCs".

While it has been found that prior antireflective compositions may be effective for many antireflective applications, prior compositions also may pose some potential performance limitations, e.g. when the antireflective compositions are used with resist compositions to pattern features of sub-micron or sub-half micron dimensions.

More particularly, antireflective compositions are perhaps most frequently applied over topography where substrate reflections can be especially problematic. Significant topography will exist with a wide variety of microelectronic device substrates. For example, field oxide isolation and trench isolation fabrication techniques produce significant topography, including vertical and sloping steps, over which photoresist compositions are applied and processed.

However, current antireflective compositions often do not form uniform coating layers over such topography. For example, current ARCs applied by preferred methods of spin coating tend to pool in valley regions and drain off the high points and edges. This can result in additional etch time to clear the valley regions, ineffective amounts of ARC present on the high points and edges and variations in substrate reflectivity due to departure of the ARC coating layer thickness from the desired quarter wave thickness that can provide optimal anti-reflection properties.

It thus would be desirable to have new antireflective coating compositions. It would be particularly desirable to have antireflective compositions that can be applied as highly conformal coating layers, even when applied over substrate topography.

SUMMARY OF THE INVENTION

The present invention provides new light absorbing compositions suitable for use as antireflective coating compositions ("ARCs"), particularly for deep UV applications.

The antireflective compositions of the invention in general comprise a resin binder component that contains a high molecular weight polymer, e.g. a polymer having an $M_w$ of at least about 30,000 daltons, more preferably an $M_w$ of at least about 40,000 daltons, sill more preferably an $M_w$ of at least about 50,000, 60,000 or 70,000 daltons. Polymers having an $M_w$ of at least about 80,000, 90,000, 100,000, 110,0000, 120,000, 130,000, 140,000, 150,000, 160,000, 170,000, 180,000 or 190,000 daltons also will be suitable for use in the ARCs of the invention.

It has been surprisingly found that ARCs of the invention exhibit exceptional conformality upon application to a substrate surface. For example, ARCs of the invention can coat substantial topography such as vertical and sloping steps quite uniformly, i.e. a coating layer of substantially constant thickness across the topography.

Such substrate topography will exist in the manufacture of any of a number of microelectronic devices. For example, sloping step profiles will be formed by locol oxidation of silicon (also known as "LOCOS") treatments. Trenches will be formed by growing oxide layers between transistor areas, or other isolation techniques employed in device manufacture.

A number of approaches can be employed to incorporate the high molecular weight polymer into an ARC of the invention.

For example, the high molecular weight polymer can be the predominant component of the ARC resin binder, i.e. the high molecular weight polymer can comprise about 90 or 95 percent or more of polymer present in the ARC, excluding any crosslinker or acid generator compounds.

Alternatively, the ARC resin binder component can comprise a polymer blend where only a portion of the blend consists of high molecular weight materials. Thus, for example, extremely high polydispersity polymers which contain high molecular weight species can be employed. Such high polydispersity polymers can be readily prepared e.g. by blending different lots of polymers having significantly different $M_w$ or $M_n$. It is also not necessary that a blend partner be an identical polymer.

The ARCs of the invention are preferably crosslinking compositions, i.e. one or more components of such an antireflective composition is capable of some type of reaction that crosslinks or otherwise hardens the applied coating layer. Such crosslinking-type compositions preferably comprise an acid or acid generator compound to induce or promote such crosslinking of one or more components of the ARC. Generally preferred crosslinking antireflective compositions comprise a separate crosslinker component such as an amine-based material. The invention also includes antireflective compositions that do not undergo significant cross-linking during intended use with a photoresist composition. Antireflective compositions of the invention are suitably used with both positive-acting and negative-acting photoresist compositions.

The invention further provides methods for forming a photoresist relief image and novel articles of manufacture comprising substrates coated with an antireflective composition of the invention alone or in combination with a photoresist composition. Other aspects of the invention are disclosed infra.

DETAILED DESCRIPTION OF THE INVENTION

Figure 1:
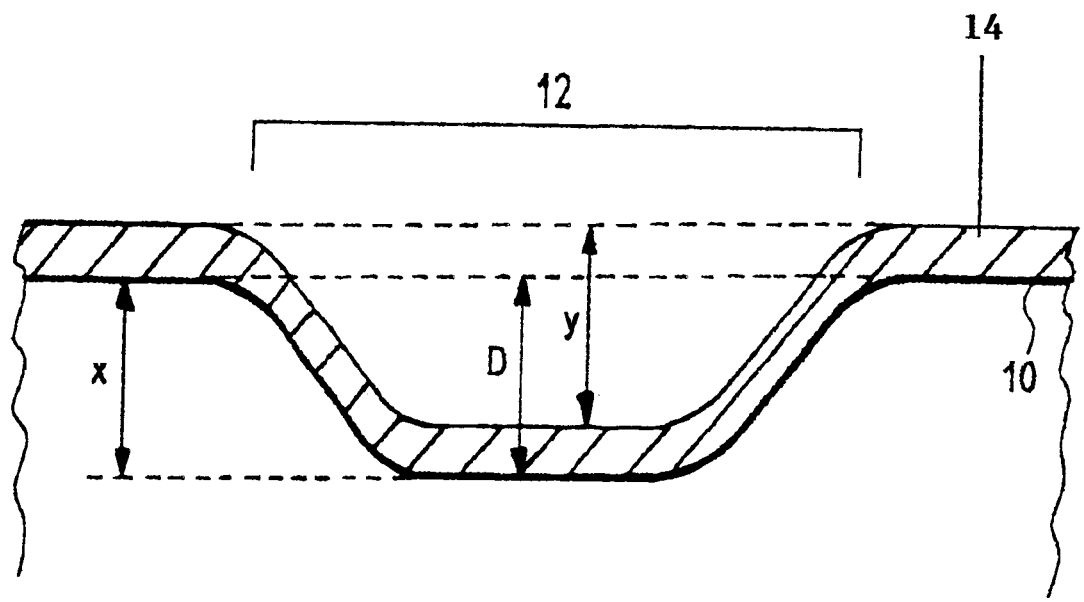
FIG. 1 shows an exemplary coated step feature formed by a LOCOS procedure.

As stated above, antireflective compositions of the invention comprise a high molecular weight polymer. The high molecular weight polymer is capable of imparting substantial conformality to an applied ARC coating layer.

One measure of a coating layer's conformality is referred to as the "degree of conformality" or "DOC", which is defined herein for a given step topography as equal to (the height of the coated substrate at a distance of at least 5 microns from the step less the height of the coated substrate at the midpoint of the step) divided by (the step height). That relationship to calculate DOC is further shown in FIG. 1 of the drawings which depicts substrate 10 having a sloping step 12 (which can be formed by LOCOS procedure) and an ARC layer 14. In FIG. 1, the value of y divided by x, or y/x, is equal to the DOC for the coating. The term "degree of conformality" or "DOC" as used herein refers to the value of y/x as depicted in FIG. 1 and discussed immediately above. As will be understand by persons skilled in the art, DOC values for a given coating composition can vary with the height and width of a given substrate step or other feature.

Preferred ARCs of the invention exhibit a DOC of at least about 0.60 for a step feature having a sloping profile formed by a local oxidation of silicon (LOCOS) procedure and a 0.8 micron width and 2 micron mid-point depth, more preferably a DOC of at least about 0.64 for a step feature having a sloping profile formed by a LOCOS procedure and a 0.8 micron width and 2 micron mid-point depth, still more preferably a DOC of at least about 0.67 for a step feature having a sloping profile formed by a LOCOS procedure and a 0.8 micron width and 2 micron mid-point depth, and even more preferably a DOC of at least about 0.68 or 0.70 for a step feature having a sloping profile formed by a LOCOS procedure and a 0.8 micron width and 2 micron mid-point depth. A "mid-point depth" of a step feature refers to herein the depth of the step as measured from the point equidistant from the step sides to the height of the top of the step, as exemplified by distance D in FIG. 1 of the drawings.

A wide variety of materials may be used as a high molecular polymer in the ARCs of the invention. The high molecular polymer preferably exhibits suitable characteristics for use in the intended applications, particularly that the polymer is capable of being dissolved in a selected solvent.

Use of a polymer blend that contains lower molecular weight species often may be preferred for the enhanced solubility such a blend provides relative to use of a resin binder that contains predominately only high molecular weight materials.

A variety of polymers can be employed as high molecular weight materials in the ARCs of the invention. For crosslinking ARCs of the invention, the polymer may suitably contain sites for reaction with other composition component(s) to effect crosslinking, although other ARC components could function as crosslinking species such as a lower molecular weight polymer blended with the high molecular weight polymer. A particularly preferred high molecular weight species is a hydroxypropylcellulose polymer. Other polymers having hydrophilic groups such as hydroxy and ether linkages are also preferred.

The resin binder component of the antireflective compositions of the invention preferably will effectively absorb reflections in the deep UV range (typically from about 100 to 300 nm). Thus, the resin binder preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophores, e.g. groups having from two to three or four fused or separate rings with 3 to 8 ring members in each ring and zero to three N, O or S atoms per ring. Such chromophores include substituted and unsubstituted phenanthryl, substituted and unsubstituted anthracyl, substituted and unsubstituted acridine, substituted and unsubstituted naphthyl, substituted and unsubstituted quinolinyl and ring-substituted quinolinyls such as hydroxyquinolinyl groups. Substituted or unsubstituted anthracyl groups are particularly preferred. For example, preferred resin binders have pendant anthracyl groups, particularly acrylic resins of the following Formula (I):

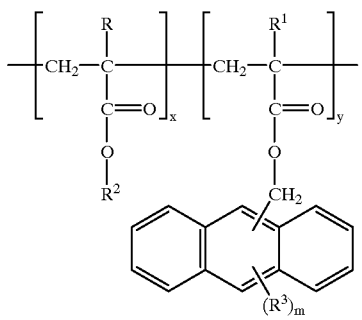

(I)

wherein each R and $R^1$ is independently a hydrogen or a substituted or unsubstituted alkyl group having from 1 to about 8 carbon atoms, preferably substituted or unsubstituted $C_{1-6}$ alkyl;

each $R^2$ is independently substituted or unsubstituted alkyl having 1 to about 10 carbon atoms, more typically 1 to about 6 carbons;

each $R^3$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

m is an integer of from 0 (where the anthracyl ring is fully hydrogen-substituted) to 9, and preferably m is 0, 1 or 2;

x is the mole fraction or percent of alkyl acrylate units in the polymer and preferably is from about 10 to about 80 percent; and y is the mole fraction or percent of anthracene units in the polymer and preferably is from about 5 to 10 to 90 percent. The polymer also may contain other units if desired, but preferably the polymer will contain at least about 10 mole percent of anthracene units. Hydroxyalkyl is a particularly preferred $R^2$ group, especially alkyl having a primary hydroxy group such as where $R^2$ is 2-hydroxyethylene (—$CH_2CH_2OH$). Preferably the resin binder contains 9-(methylene)anthracene ester units.

Another preferred resin binder comprises substituted or unsubstituted quinolinyl or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin binder is an acrylic polymer of the following Formula (II):

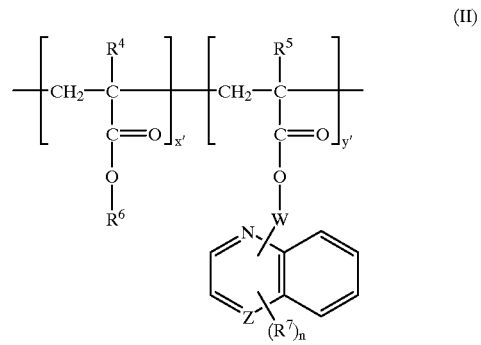

(II)

wherein each $R^4$ and $R^5$ is independently a hydrogen or a substituted or unsubstituted alkyl group having from 1 to about 8 carbon atoms, preferably substituted or unsubstituted $C_{1-6}$ alkyl;

each $R^6$ is independently substituted or unsubstituted alkyl having 1 to about 10 carbon atoms, more typically 1 to about 6 carbons;

W is a bond or substituted or unsubstituted alkylene having 1 to about 4 carbons, and preferably is a bond;

Z is a carbon, nitrogen, oxygen or sulfur;

each $R^7$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

n is an integer of from 0 (where the ring is fully hydrogen-substituted) to 7, and preferably n is 0, 1 or 2.

x' is the mole fraction or percent of alkyl acrylate units in the polymer and preferably is from 10 to about 80 percent; and y' is the mole fraction or percent of quinolinyl or hydroxyquinolinyl units in the polymer and preferably is from about 5 to about 90 percent. The polymer also may contain other units if desired, but preferably the polymer will contain at least about 10 mole percent of quinolinyl and/or hydroxyquinolinyl units. Hydroxyalkyl is a particularly preferred $R^6$ group, especially alkyl having a primary hydroxy group such as where $R^6$ is 2-hydroxyethylene.

The above-mentioned substituted groups (including substituted groups $R^1$ through $R^7$ and W) may be substituted at one or more available positions by one or more suitable groups such as e.g. halogen (particularly F, Cl and Br); cyano; hydroxyl, nitro, alkanoyl such as a $C_{1-6}$ alkanoyl group such as acyl and the like; alkyl groups having from 1 to about 8 carbon atoms; alkenyl and alkynyl groups having one or more unsaturated linkages and 2 to about 8 carbon atoms; alkoxy groups having from 1 to about 6 carbons; etc.

Resin binders for antireflective compositions of the invention are preferably synthesized by polymerizing two or more different monomers where at least one of the monomers includes a chromophore group, e.g. an anthracenyl, quinolinyl or hydroxyquinolinyl group. A free radical polymerization is suitably employed, e.g., by reaction of a plurality of monomers to provide the various units in the presence of a radical initiator preferably under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See Example 1 which follows for exemplary reaction conditions. Suitable reaction temperatures for any particular system can be readily determined empirically by those skilled in the art based on the present disclosure. A reaction solvent may be employed if desired. Suitable solvents include alcohols such as propanols and butanols and aromatic solvents such as benzene, chlorobenzene, toluene and xylene. Dimethylsulfoxide, dimethylformamide and THF are also suitable. The polymerization reaction also may be run neat. A variety of free radical initiators may be employed to prepare the copolymers of the invention. For example, azo compounds may be employed such as azo-bis-2,2'-isobutyronitrile (AIBN) and 1,1'-azobis (cyclohexanecarbonitrile). Peroxides, peresters, peracids and persulfates also can be employed.

Also, while less preferred, a preformed resin may be functionalized with chromophore units. For example, a glycidyl phenolic resin such as a glycidyl novolac can be reacted with an anthranyl carboxylic acid.

Resin binders of antireflective compositions of the invention preferably exhibit good absorbance at deep UV wavelengths such as within the range of from 100 to about 300 nm. More specifically, preferred resin binders of the invention have optical densities of at least about 3 absorbance units per micron (Absorb. units/$\mu$) at the exposing wavelength utilized (e.g. about 248 nm or about 193 nm), preferably from about 5 to 20 or more absorbance units per micron at the exposing wavelength, more preferably from about 4 to 16 or more absorbance units per micron at the exposing wavelength utilized. Higher absorbance values for a particular resin can be obtained by increasing the percentage of chromophore units on the resin.

While antireflective composition resin binders having such absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

Preferably, high molecular resins used in the ARCs of the invention will have a weight average molecular weight (Mw) of about 40,000 to about 10,000,000 daltons, more typically about 40,000 to about 1,000,000 daltons. An upper $M_w$ limit of about 200,000 daltons will be preferred in many applications, particularly to provide suitable solvency characteristics, although good results also can be obtained with use of polymers having an $M_w$ in excess of 200,000. Molecular weights of polymers used in the ARCs of the invention are suitably determined by gel permeation chromatography.

The concentration of the resin binder component of the antireflective compositions of the invention may vary within relatively broad ranges, and in general the resin binder is employed in a concentration of from about 50 to 95 weight percent of the total of the dry components of the antireflective composition, more typically from about 60 to 90 weight percent of the total dry components (all components except solvent carrier). If a polymer blend is employed, where a high molecular weight material is present with other lower molecular weight polymers, the high molecular weight material may be present in quite low amounts for enhanced conformality to be exhibited, e.g. where the high molecular weight material constitutes about 2 to 3 percent by weight of the total polymer percent in an ARC. However, more typically, the high molecular weight material will represent at least about 10 weight percent of total polymer present in an ARC, even more typically the high molecular weight material will represent at least about 20 to 50 weight percent of total polymer present in an ARC.

Crosslinking-type antireflective compositions of the invention also contain a crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as a melamine materials, including melamine resins such as manufactured by American Cyanamid and sold under the tradename of Cymel 300, 301, 303, 350, 370, 380, 1116 and 1130. Glycourils are particularly preferred including glycourils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65 and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Low basicity antireflective composition crosslinkers are particularly preferred such as a methoxy methylated glycouril. A specifically preferred crosslinker is a methoxy methylated glycouril corresponding to the following structure (III):

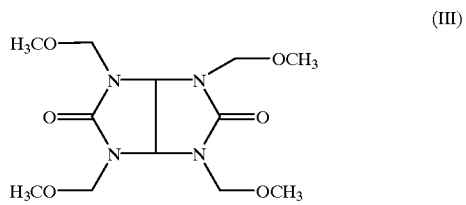

(III)

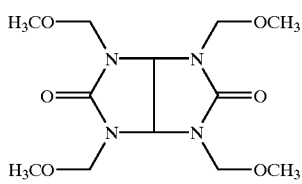
(III)

This methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$ hydroxyalkyl substituents. Phenol compounds are generally preferred such as di-methanolphenol $(C_6H_3(CH_2OH)_2OH)$ and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a low basicity crosslinker such as a methoxy methylated glycouril used in antireflective compositions of the invention can provide excellent lithographic performance properties, including significant reduction (SEM examination) of undercutting or footing of an overcoated photoresist relief image.

A crosslinker component of antireflective compositions of the invention in general is present in an amount of between 5 and 50 weight percent of total solids (all components except solvent carrier) of the antireflective composition, more typically in an amount of about 7 to 25 weight percent total solids.

Crosslinking antireflective compositions of the invention preferably further comprise an acid or acid generator compound, particularly a thermal acid generator compound, for catalyzing or promoting crosslinking during curing of an antireflective composition coating layer. Preferably a thermal acid generator is employed, i.e. a compound that generates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Typically a thermal acid generator is present in an antireflective composition in concentration of from about 0.1 to 10 percent by weight of the total of the dry components of the composition, more preferably about 2 percent by weight of the total dry components.

Also, rather than a thermal acid generator, an acid may be simply formulated into the antireflective composition, particularly for antireflective compositions that require heating to cure in the presence of acid so that the acid does not promote undesired reaction of composition components prior to use of the antireflective composition. Suitable acids include e.g. strong acids such as sulfonic acids such as toluene sulfonic acid and sulfonic acid, triflic acid, or mixtures of those materials.

The present invention also includes antireflective compositions that do not undergo significant cross-linking during intended use with a photoresist composition. Such non-crosslinking antireflective compositions need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or acid surface for promoting a crosslinking reaction.

Antireflective compositions of the invention preferably also comprise one or more photoacid generators (i.e. "PAG") that are suitably employed in an amount sufficient to inhibit or substantially prevent undesired notching or footing of an overcoated photoresist layer. In this aspect of the invention, the photoacid generator is not used as an acid source for promoting a crosslinking reaction, and thus preferably the photoacid generator is not substantially activated during crosslinking of the antireflective composition (in the case of a crosslinking ARC). In particular, with respect to antireflective compositions that are thermally crosslinked, the antireflective composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$ alkyl or $C_{2-5}$ alkenyl having one or preferably two or more fluoro substituents.

Particularly preferred antireflective composition photoacid generators of the invention can be activated upon exposure to deep UV radiation, particularly about 248 nm and/or about 193 nm, so that the antireflective composition can be effectively used with overcoated deep UV photoresists. Suitably the photoacid generator of the antireflective composition and the photoacid generator of the photoresist composition will be activated at the same exposure wavelength. Sensitizer materials formulated into the photoresist composition and/or antireflective compositions also can be used to ensure that a single exposure wavelength will activate the photoacid generators of both the antireflective and photoresist compositions.

It is further preferred that an antireflective composition of the invention is used together with a photoresist composition where the antireflective composition photoactive compound and photoresist photoactive compound generate the same or approximately the same acid compound (photoproduct) upon exposure to activating radiation during irradiation of the photoresist layer, i.e. photoproducts that preferably have similar diffusion characteristics and similar acid strengths. It has been found that resolution of an overcoated resist relief image is even further enhanced with such matching of the respective antireflective composition and resist photoacid products. References herein to "substantially the same" antireflective composition and resist photoacid products means that those two photoproducts differ no more than no about 2 or 2.5 in $pK_a$ values (measured at 25° C.), preferably the two photoproducts differ no more than about 1 or 1.5 in $pK_a$ values, and still further preferably the two photoproducts differ no more than about 0.75 in $pK_a$ values. It is further preferred that such "substantially the same" antireflective composition and resist photoacid products differ in molecular weight by no more than about 40 percent, preferably by no more than about 20 percent, still more preferably by no more than about 15 percent. It is still further preferred that the antireflective composition and resist photoproducts are each of the same class of acids, e.g. that both photo products are sulfonate acids or both are halo-acids such as HBr and the like. Suitable amounts of the PAG can vary rather widely and can be readily determined empirically. In general, the one or more PAGs of an antireflective composition of the invention may be suitably employed in amounts of about 0.25 to 5 weight percent or less based on total weight of the antireflective composition. See the examples which follow for exemplary amounts. Particularly preferred amounts of a PAG of an antireflective composition also may vary depending on the characteristics and processing conditions of the photoresist that is used with the antireflective composition. For instance, if the photoresist photoacid generator produces a relatively strong acid photoproduct whereby the photoresist is post-exposure baked (PEB) at relatively low temperatures, then the photoacid product of the antireflective composition will be less likely to thermally decompose at such low PEB temperatures, resulting in a relatively higher effective concentration of acid in the antireflective composition. Accordingly, that antireflective composition can be effectively formulated with a relatively lower concentration of photoacid generator. Conversely, if a photoresist is used that is post-exposure baked at relatively high temperatures, then a portion of the photoacid product of the antireflective composition may be more likely to be thermally decomposed. In such case, the antireflective composition may be formulated with a relatively higher concentration of photoacid generator to ensure an effective concentration of photogenerated acid and maximum reductions of undesired footing.

Onium salts may be employed as photoacid generators of antireflective compositions of the invention. Onium salts that are weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442, 197; 4,603,101; and 4,624,912.

Substituted dipehenyl iodonium camphor sulfonate compounds are preferred onium PAGs for antireflective compositions of the invention, particularly sulfonate salts. Two specifically preferred agents are the following PAGS 1 and 2:

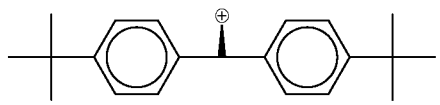

1

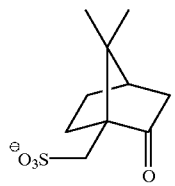

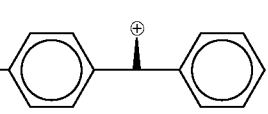

2

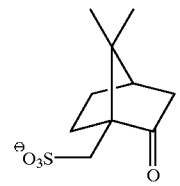

Such iodium compounds can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then (+/−)-10-camphorsulfonic acid added followed by neutralization with ammonium hydroxide. Sulfonate PAG 2 above can be prepared by the same procedures as disclose din that European Application, except approximately molar equivalents of t-butyl benzene and benzene would be reacted together in the first step with acetic anhydride and $KIO_3$.

Other suitable PAGS including sulfonated esters and sulfonyloxy ketones. See J. of Photopolymer Science and Technology, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Other useful acid generators for antireflective compositions of the invention include the family of nitrobenzyl esters, and the s-triazine derivatives. Suitable s-triazine acid generators are disclosed, for example, in U.S. Pat. No. 4,189,323.

Halogenated non-ionic, photoacid generating compounds also may be suitable for antireflective compositions of the invention such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl)benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3-dibromopropyl] isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris(trichloromethyl)triazine.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

ARCs of the invention can be prepared by generally known procedures. To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition. Generally particularly preferred photoresists for use with antireflective compositions of the invention are positive-acting and negative-acting chemically-amplified resists. A number of chemically-amplified resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. A particularly preferred chemically amplified photoresist for use with an antireflective composition of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

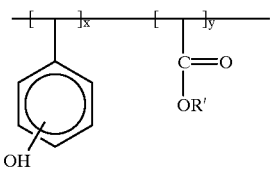

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Preferred negative-acting resist compositions for use with an antireflective composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with antireflective compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al. The above camphorsulfonate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

Antireflective compositions of the invention that include a low basicity crosslinker such as a suitable glycouril are particularly useful with photoresists that generate a strong acid photoproduct upon exposure such as triflic acid, camphor sulfonate or other sulfonic acid, or other acid having a pKa (25° C.) of about 2 or less. Without wishing to be bound by theory, it is believed that antireflective compositions of the invention are particularly effective with such strong acid resists because the strong photogenerated acid will migrate from the resist and remain in the antireflective composition layer to a lesser extent relative to a comparable antireflective composition that contains a more basic crosslinker. That is, the low basicity crosslinkers of the invention will tie up strong photogenerated acids of an overcoated resist layer to a lesser extent than a more basic antireflective composition crosslinker. As a result, less acid loss from the resist layer will occur and resolution problems such as footing will be even further reduced.

In use, an antireflective composition of the invention is applied as a coating layer to a substrate by any of a variety of methods such as spin coating. The antireflective composition in general is applied on a substrate with a dried layer thickness of between about 0.02 and 0.5 $\mu$m, preferably a dried layer thickness of between about 0.04 and 0.20 $\mu$m. The substrate is suitably any substrate used in processes involving photoresists. For example, the substrate can be silicon, silicon dioxide or aluminum—aluminum oxide microelectronic wafers. Gallium arsenide, ceramic, quartz or copper substrates may also be employed. Substrates used for liquid crystal display or other flat panel display applications are also suitably employed, for example glass substrates, indium tin oxide coated substrates and the like. Substrates for optical and optical-electronic devices (e.g. waveguides) also can employed.

Preferably the antireflective layer is cured before a photoresist composition is applied over the antireflective composition. Cure conditions will vary with the components of the antireflective composition. Thus, if the composition does not contain an acid or thermal acid generator, cure temperatures and conditions will be more vigorous than those of a composition containing an acid or acid generator compound. Typical cure conditions are from about 120° C. to 225° C. for about 0.5 to 40 minutes. Cure conditions preferably render the antireflective composition coating layer substantially insoluble to the photoresist solvent as well as an alkaline aqueous developer solution.

After such curing a photoresist is applied over the surface of the antireflective composition. As with application of the antireflective composition, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the antireflective composition layer and photoresist layer should occur.

The resist layer is then imaged with activating radiation through a mask in conventional manner. The exposure energy is sufficient to effectively activate the photoactive component of the resist system to produce a patterned image in the resist coating layer as well as activate the photoacid generator of at least a portion of the thickness of antireflective composition layer so that photogenerated acid from the PAG of the antireflective composition is present at the antireflective composition/resist coating layers interface. The exposure energy typically ranges from about 1 to 300 mJ/cm$^2$ and depending in part upon the exposure tool and the particular resist and resist processing that is employed. If the ARC also contains a photoacid generator to reduce undeisred notching and footing, generally exposure doses used for typical imaging of a resist layer will be sufficient to photoactivate an effective amount of acid in the underlying antireflective composition layer.

The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antihalation coating layer.

All documents mentioned herein are incorporated herein by reference. The following non-limiting examples are illustrative of the invention.

EXAMPLE 1

Preparation of High Molecular Polymers

Preferred polymers for use in ARCs of the invention can be prepared as follows.

Hydroxyethyl methacrylate (HEMA)/methylanthracene methacrylate (ANTMA) copolymer (Formula I above) are suitably prepared by charging a 300 ml 3N round bottom flask equipped with magnetic stirrer, condenser, nitrogen and vacuum inlet with 16.0 g (0.1229 mol) HEMA (purified by distillation), 8.49 g (0.0307 mol) methylanthracene methacrylate, 0.2449 g (1 wt. %) AIBN and 180 ml THF. Other amounts of HEMA and ANTMA monomers can be suitably employed to provide HEMA/ANTMA copolymers having other HEMA and/or ANTMA units mole percents. The reaction flask is quenched in liquid nitrogen while being purged with nitrogen. When the contents of the reaction flask are frozen, the flask is evacuated, then purged with nitrogen (3 times). The reaction mixture is stirred under reflux until reaction completion, e.g. about 18 hours. The pale yellow polymer is precipitated into 3000 ml ether, filtered, then dried at 50° C. under vacuum to provide the HEMA/ANTMA copolymer.

By the above general procedure, the following six polymers (referred to herein as "Polymers 1–6" herein) were prepared having the $M_w$ and mole percent of ANTMA units (balance of polymer units being HEMA units) as specified immediately below. Each of Polymers 1–6 had a dispersity of less than 2.

| Polymer # | Mole percent ANTMA units | $M_w$ |
|---|---|---|
| 1 | 26 | 26,000 |
| 2 | 39 | 35,000 |
| 3 | 19 | 50,000 |
| 4 | 19 | 59,000 |
| 5 | 26 | 70,000 |
| 6 | 39 | 119,000 |

EXAMPLE 2

Preparation and Processing of ARCS of the Invention

Six antireflective compositions of the invention (referred to as ARCs 1–6) were prepared by mixing the components set forth below, with component amounts expressed as parts by weight based on total weight of solids of the ARC. All the ARCs had the same components and amounts thereof, expect for the Resin binder component. ARC 1 had a resin binder component that consisted of Polymer 1; ARC 2 had a resin binder component that consisted of Polymer 2; ARC 3 had a resin binder component that consisted of Polymer 3; ARC 4 had a resin binder component that consisted of Polymer 4; ARC 5 had a resin binder component that consisted of Polymer 5; and ARC 6 had a resin binder component that consisted of Polymer 6.

Components of ARCs 1–6:
1) Resin binder: 86.4 weight % of one of Polymers 1–6
2) Crosslinker: 12 weight % Powderlink 1174 (American Cyanamid)
3) Thermal acid generator: 1.5 weight % p-nitrobenzyltosylate
4) Surfactant: 0.1 weight % FC-431 (3M Co.)

Each of ARCs 1–6 was formulated as a liquid coating composition to provide a composition that was 20 weight % solids in a solvent that included 18 weight % ethyl lactate, 10 weight % cyclohexanone and 68.97 weight % propylene glycol monomethyl ether.

Each of the ARCs was separately spin coated onto separate oxide layers on silicon substrates that had a 180 nm deep trench. The applied ARC layers were each baked on a vacuum hot plate at 175° C. for 60 seconds to provide a resulting thickness of approximately 600 angstroms on surface substrate greater than 5 microns from the trench feature.

The thickness of each ARC layer was measured at the mid-point of the trench feature and then at 5 microns from the trench. DOC values were then determined for each of the ARCs with values set forth immediately below:

| ARC # | DOC value |
|---|---|
| 1 | 0.645 |
| 2 | 0.65 |
| 3 | 0.66 |
| 4 | 0.67 |
| 5 | 0.69 |
| 6 | 0.72 |

The foregoing description of the invention is merely illustrative thereof, and it is understood that variations and modifications can be effected without departing from the scope or spirit of the invention as set forth in the following claims.

What is claimed is:

1. A method for forming a photoresist relief image and a conformal antireflective composition coating layer over a substrate having topography that includes a step feature having a width of at least 0.8 microns and at least about a 2 micron mid-point depth, the method comprising:

(a) applying, on the substrate over the step feature having a width of at least about 0.8 microns and at least about a 2 micron mid-point depth, a layer of a conformal antireflective composition that comprises a crosslinker and a polymer having a molecular weight ($M_w$) of about 40,000 or greater, and wherein the antireflective composition exhibits a DOC of about 0.60 or greater for a step feature having a sloping profile and a 0.8 micron width and 2 micron mid-point depth; and (b) applying a layer of a photoresist composition over the antireflective composition layer.

2. The method of claim 1 wherein the antireflective layer is thermally cured prior to applying the photoresist composition layer.

3. The method of claim 1 wherein the polymer has a molecular weight ($M_w$) of about 50,000 or greater.

4. The method of claim 1 wherein the polymer has a molecular weight ($M_w$) of about 50,000 or greater.

5. The method of claim 1 wherein the polymer has a molecular weight ($M_w$) of about 70,000 or greater.

6. The method of claim 1 wherein the polymer has a molecular weight ($M_w$) of about 80,000 or greater.

7. The method of claim 1 wherein the polymer has a molecular weight ($M_w$) of about 90,000 or greater.

8. The method of claim 1 wherein the polymer has a molecular weight ($M_w$) of about 100,000 or greater.

9. The method of claim 1 wherein the crosslinker is a melamine or benzoquanamine material.

10. The method of claim 1 wherein the photoresist composition is a chemically-amplified positive-acting resist.

11. The method of claim 1 wherein the photoresist layer is exposed to radiation having a wavelength of about 248 nm.

12. The method of claim 1 wherein the photoresist layer is exposed to radiation having a wavelength of about 193 nm.

13. The method of claim 1 wherein the antireflective composition further comprises a thermal acid generator compound.

14. The method of claim 1 wherein the antireflective composition exhibits a DOC of about 0.64 or greater for a step feature having a sloping profile and a 0.8 micron width and 2 micron mid-point depth.

15. The method of claim 1 wherein the antireflective composition exhibits a DOC of about 0.70 or greater for a step feature having a sloping profile and a 0.8 micron width and 2 micron mid-point depth.

16. A method for forming a photoresist relief image and conformal antireflective composition coating layer over a substrate having topography that includes a step feature having a width of at least 0.8 microns and at least about a 2 micron mid-point depth, the method comprising:

(a) applying, on the substrate over the step feature having a width of at least about 0.8 applying, on the substrate over the step feature heaving a width of at least about 0.8 microns and at least about a 2 micron mid-point depth, a layer of a conformal antireflective composition that comprises a polymer having a molecular weight ($M_w$) of about 40,000 or greater, and wherein the antireflective composition exhibits a DOC of about 0.60 or greater for a step feature having a sloping profile and a 0.8 micron width and 2 micron mid-point depth; and (b) thermally curing the applied antireflective composition layer; and (c) applying a layer of photoresist composition over the thermally cured antireflective composition layer.

17. The method of claim 16 wherein the polymer has a molecular weight ($M_w$) of about 50,000 or greater.

18. The method of claim 16 wherein the polymer has a molecular weight ($M_w$) of about 60,000 or greater.

19. The method of claim 16 wherein the polymer has a molecular weight ($M_w$) of about 70,000 or greater.

20. The method of claim 16 wherein the polymer has a molecular weight ($M_w$) of about 80,000 or greater.

21. The method of claim 16 wherein the polymer has a molecular weight ($M_w$) of about 90,000 or greater.

22. The method of claim 16 wherein the polymer has a molecular weight ($M_w$) of about 100,000 or greater.

23. The method of claim 16 wherein the antireflective composition further comprises a crosslinker.

24. The method of claim 23 wherein the crosslinker is a melamine or benzoquanamine material.

25. The method of claim 16 wherein the photoresist composition is a chemically-amplified positive-acting resist.

26. The method of claim 16 wherein the photoresist layer is exposed to radiation having a wavelength of about 248 nm.

27. The method of claim 16 wherein the photoresist layer is exposed to radiation having a wavelength of about 193 nm.

28. The method of claim 16 wherein the antireflective composition further comprises a thermal acid generator compound.

29. The method of claim 16 wherein the antireflective composition exhibits a DOC of about 0.64 or greater for a step feature having a sloping profile and a 0.8 micron width and 2 micron mid-point depth.

30. The method of claim 16 wherein the antireflective composition exhibits a DOC of about 0.70 or greater for a step feature having a sloping profile and a 0.8 micron width and 2 micron mid-point depth.

* * * * *